US009103860B2

(12) United States Patent
Sosin et al.

(10) Patent No.: US 9,103,860 B2
(45) Date of Patent: Aug. 11, 2015

(54) SYSTEM FOR MEASURING ELECTRICAL CHARGE

(75) Inventors: Zbigniew Sosin, Wieliczka (PL); Maciej Sosin, Wieliczka (PL); Marek Adamczyk, Oswiecim (PL)

(73) Assignee: UNIWERSYTET JAGIELLONSKI, Krakow (PL)

( * ) Notice: Subject to any disclaimer, the term of this patent is extended or adjusted under 35 U.S.C. 154(b) by 99 days.

(21) Appl. No.: 13/985,594

(22) PCT Filed: Feb. 22, 2012

(86) PCT No.: PCT/IB2012/050816
§ 371 (c)(1),
(2), (4) Date: Oct. 15, 2013

(87) PCT Pub. No.: WO2012/114291
PCT Pub. Date: Aug. 30, 2012

(65) Prior Publication Data
US 2014/0049269 A1    Feb. 20, 2014

(30) Foreign Application Priority Data
Feb. 22, 2011 (PL) .......................... 393985

(51) Int. Cl.
G01R 27/08 (2006.01)
G01R 27/26 (2006.01)
G01R 29/24 (2006.01)
H03F 1/52 (2006.01)

(52) U.S. Cl.
CPC ............ *G01R 27/2605* (2013.01); *G01R 29/24* (2013.01); *H03F 1/523* (2013.01)

(58) Field of Classification Search
CPC ..... G01R 27/2605; G01R 29/24; H03F 1/523
USPC .................................................. 324/658–690
See application file for complete search history.

(56) References Cited

U.S. PATENT DOCUMENTS

| | | | |
|---|---|---|---|
| 5,374,897 A * | 12/1994 | Moraveji | 330/252 |
| 5,537,078 A * | 7/1996 | Strong | 330/253 |
| 6,680,837 B1 * | 1/2004 | Buxton | 361/93.9 |
| 1996/5537078 | 7/1996 | Strong | |
| 1997/5610426 | 3/1997 | Asahi et al. | |
| 2001/6307223 | 10/2001 | Yu | |
| 2007/0188191 A1 | 8/2007 | Alenin et al. | |
| 2008/0191713 A1 * | 8/2008 | Hauer et al. | 324/658 |
| 2009/0045816 A1 | 2/2009 | Robinson | |
| 2010/0049459 A1 * | 2/2010 | De Geronimo | 702/64 |
| 2011/0063031 A1 * | 3/2011 | Hsu et al. | 330/254 |

FOREIGN PATENT DOCUMENTS

DE  19841308 A  6/2000

* cited by examiner

*Primary Examiner* — Melissa Koval
*Assistant Examiner* — Farhana Hoque
(74) *Attorney, Agent, or Firm* — Mark M. Friedman

(57) ABSTRACT

A system for measuring electrical charge, comprising a capacitance detector (110) connected to a charge integrator (120) being an operational amplifier with a capacitance feedback (130), in which the input stage (121) of the charge integrator (120) comprises a pair of symmetrically connected JFET-type transistors (T1; T2), having gates connected to the input of the charge integrator (120).

3 Claims, 3 Drawing Sheets

SYSTEM FOR MEASURING ELECTRICAL CHARGE

The present invention relates to systems for measuring electrical charge. Precise systems for measuring electrical charge may be used in situations when the evaluation of a medium is based on measuring the motion of a generated electrical charge, for example during measurements of ionisation in ionising particle detectors. These particles may be charged elemental particles, atomic nuclei or X or gamma photons. Systems of this type may be used in other physical setups as well.

Systems are known for measuring electrical charge using a charge integrator. A typical structure of this type is shown in FIG. 1. The system comprises a capacitance detector 110 connected to a charge integrator 120, which is an operational amplifier with capacitance feedback 130. Such systems have been demonstrated in the publication by K. Korbel, "Elektronika Front End" ("Front end electronics") (Uczelniane Wydawnictwa Naukowo-Dydaktyczne, Kraków 2000).

Measurement of electrical charge q in a system of this type is based on transferring a charge accumulated in the detector system onto a reference capacity $C_f$ of the feedback and reading the charge of this capacity, which is described by the equation:

$$u = \frac{q}{C_f}$$

The capacitance of the detector 110 $C_d$ is connected to the input of the charge integrator 120, which is represented by the input impedance. This impedance has a capacitive character and mainly comprises the dynamic capacitance of the system $C_{dyn}=(K+1)C_f$ and is slightly modified by an input geometric capacitance $C_{wej}$ connected in parallel thereto. This parallel connection of the detector capacitance $C_d$ and input capacitance $C_{wej}$ results in that the charge q accumulated in the detector in the section αq is transferred to the capacitance $C_f$. The coefficient α is equal to:

$$\alpha = \frac{C_{wej} + (K+1)C_f}{C_d + C_{wej} + (K+1)C_f}$$

Because the amplification K by the amplifier system (without feedback) is very large (usually $K=10^3 \ldots 10^9$), for typical capacitance values, $C_f$, $C_{wej}$, $C_d$ (in the range from one to several hundred pF), the coefficient α is close to unity. For this reason, almost the entire charge collected by the detector is transferred into the capacitance feedback. The size of the charge q collected by the detector depends on the size of the detector, its type (the substance used, i.e. gas or solid-semiconductor) as well as the value of the electrical field, which accumulates the generated charge. To accumulate this charge optimally, relatively high voltage is used for powering the detection system. This causes quite a high risk to the amplifier input system. Integrator structures are known, in which the input stage of the amplifier makes use of JFET transistors. An example of such a structure is shown in FIG. 2. The main advantage of this solution stems from the optimal ratio of the detector signal to system thermal noise for JFET $T_1'$ transistors. In this type of amplifier, it is possible to obtain a low degree of noise diffusion. The gate-source junction in JFET $T_1'$ transistors is reverse biased, and thus is characterised by a high resistance, in the range of $10^8$-$10^9$ Ohm. The junction voltage may change ranges, from a negative value defining the cut-off voltage to a neutral value, at which the transistor current reaches the saturation current. If the input voltage is outside this range (from ca. −5V to 0V), then this may constitute a threat to the input system, particularly in the case of larger voltages polarizing towards the reverse bias range. For typical JFETs, an excess of only several volts beyond the cut-off voltage may lead to their destruction. In a system for measuring charges, this situation may be caused by an excessively rapid disconnection of voltage of the detector (the sensor electrode), a short-circuit to the detector (the sensor electrode) or the appearance of another electrical field impulse on the sensor electrode.

Damage may be prevented by construction of high voltage regulation systems, which are safeguarded against rapid voltage changes. These systems, however, do not safeguard the amplifier against short-circuits to the detector. Such short-circuits are possible particularly in the case of multiplying detectors, such as gas counters and diodes that make use of the avalanche effect. These detectors operate at voltages close to the breakdown voltages, and therefore even at small fluctuations, due for example to small changes in a gas pressure, a charge that destroys the input amplifier stage may occur.

Safeguarding systems may be used, for example, in the form of a semiconducting diode 140 shown in FIG. 1. Such a diode, upon exceeding the critical voltage, shortcuts its further increase, which accumulates in the small resistance connected to the input. These solutions are relatively secure, but due to their passive nature, they cause additional noise. This is particularly undesirable in sensitive applications, which require low noise levels, such as for example the detection of the elements through the identification of their characteristic X-ray radiation.

The aim of the present invention is to design an active protection for the input amplifier stage against an input voltage level in excess of the permissible range, which does not deteriorate the noise characteristics of the amplifier.

The object of the present invention is a system for measuring electrical charges, comprising a capacitance detector connected to the charge integrator in form of an operational amplifier with a capacitance feedback, in which the input stage of the charge integrator comprises a pair of symmetrically connected JFET-type transistors, having gates connected to the input of the charge integrator.

The input stage of the charge integrator may comprise at least two parallel pairs of symmetrically connected JFET-type transistors.

The input stage the charge integrator may be connected to symmetrically connected common base amplifiers.

In the input stage of the charge integrator, a key in parallel with a current source may be connected to each source of the symmetrically connected transistors, wherein the system may further comprise a system for evaluating the output voltage of the charge integrator, configured to open one of the keys when the output voltage exceeds the upper voltage limit and to open the other key when the output voltage drops below the lower voltage limit.

The object of the present invention has been illustrated in exemplary embodiments in the drawings, where:

Figure 1:
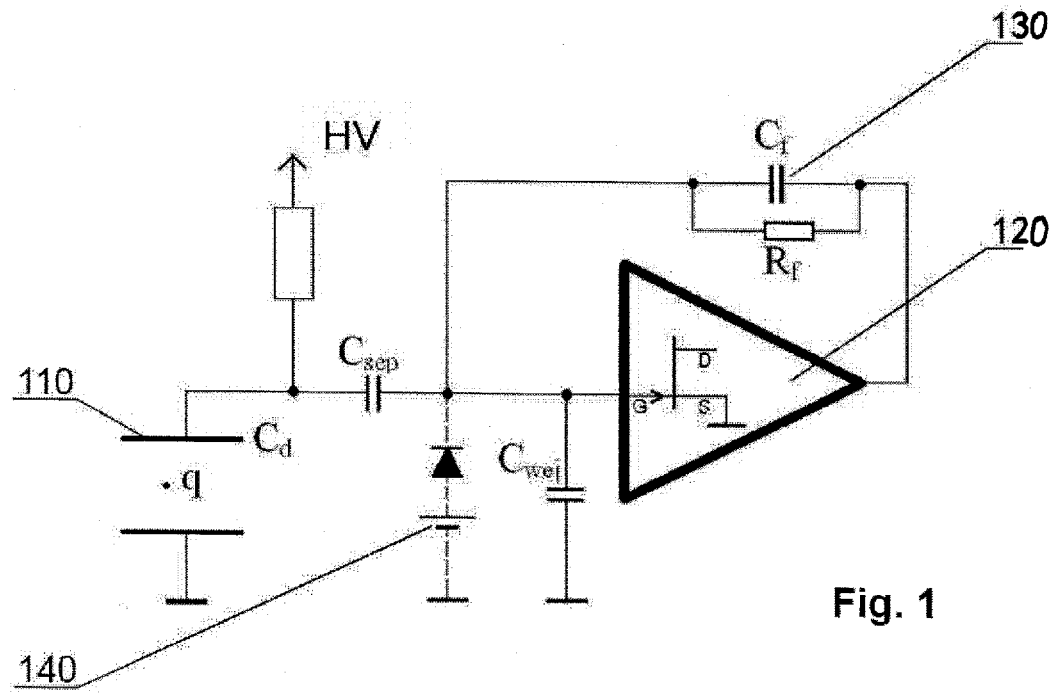
FIG. 1 represents a general structure of the system for measuring electrical charge.
Figure 2:
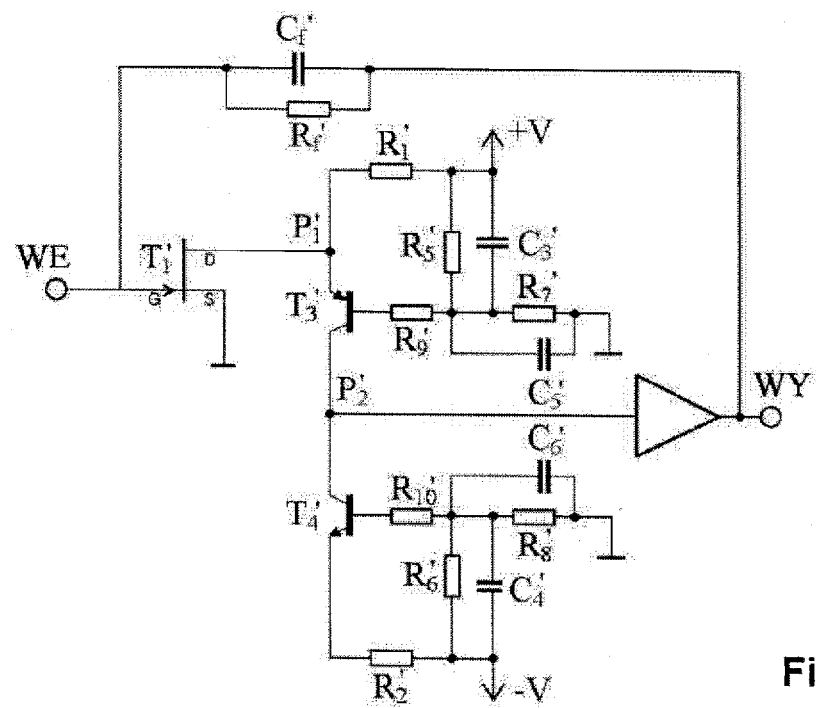
FIG. 2 represents a schematic of a prior art charge integrator.
Figure 3:
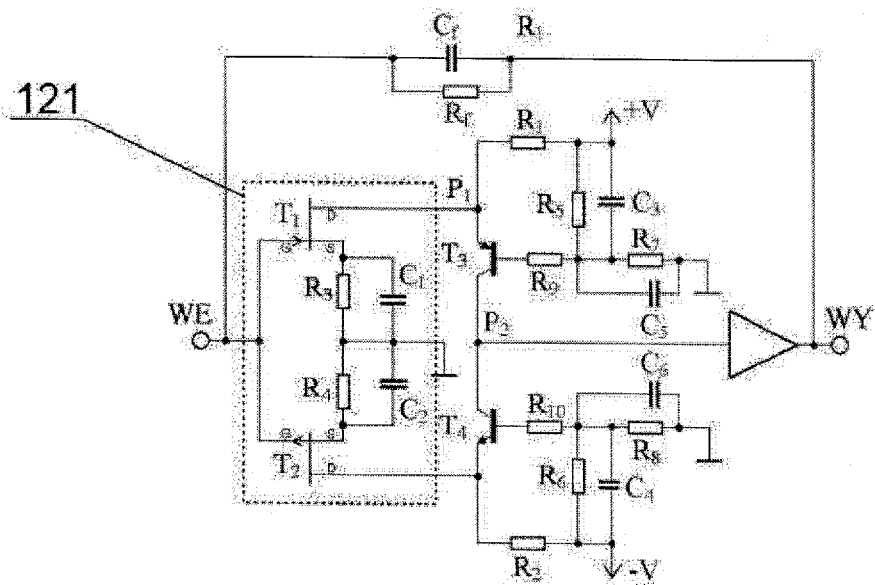
FIG. 3 represents a schematic of the charge integrator according to the present invention.
Figure 4:
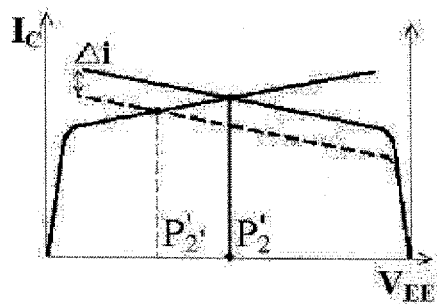
FIG. 4 represents a change in the potential of the operating point in the charge integrator of FIG. 2, wherein $V_{EE}$ represents the voltage between the emitters of transistors $T_3'$ and $T_4'$.
Figure 5:
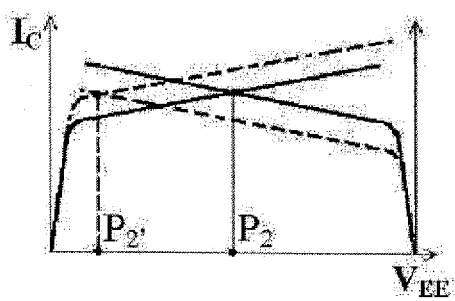
FIG. 5 represents a change in the potential of the operating point in the charge integrator of FIG. 3, wherein $V_{EE}$ represents the voltage between the emitters of transistors $T_3$ and $T_4$.

The structure of the charge integrator, constituting an element of the system for measuring electrical charge according to the present invention, is shown in FIG. 3. The input stage 121 of the charge integrator comprises a pair of symmetrically connected JFET transistors: T1, T2, whose gates are connected to the input of the charge integrator 120. The structure of the input system, which is symmetrical due to the type of transistors used, forces the symmetrical operation of the system and of the powering voltages, which define the system's operating point. As in the typical solution shown in FIG. 2, transistor T1 along with transistor T3 are powered by a current source, which due to the constant voltage at point $P_1$ is formed by resistor $R_1$. The approximate stability of the voltage at point $P_1$ is the result of powering of the base of transistor $T_3$ by constant voltages (the emitter voltage is higher than this voltage approximately by the constant voltage of the base-emitter junction). Should a negative potential impulse occur, the current flowing through transistor $T_1$ is decreased. Because transistors $T_1$ and $T_3$ are powered by a common current source, resistor $R_1$, a drop in the current flowing through transistor T1 causes an identical (in amplitude) increase in the current flowing through transistor $T_3$. Transistor $T_3$ may be treated as a portion of the common base amplifier. In the solution shown in FIG. 2, the active load of this system constitutes a current source formed by transistor $T_4'$, and the principle underlying the generation of the amplified signal is shown in FIG. 4. FIG. 4 represents a shift in the potential of point $P_2'$ as the result of the intersection between the collector characteristics of the current source formed by transistor $T_4'$ and transistor $T_3'$, wherein $V_{EE}$ is the voltage between the emitters of transistors $T_3'$ and $T_4'$. In the case of the solution according to the present invention, transistor $T_4$ constitutes both a load for transistor $T_3$, as well as it by itself constitutes symmetrically a part of the amplifier OB., for which transistor $T_3$ constitutes an active load. In the case of a negative impulse, the input causes a current decrease in transistor $T_1$ and a simultaneous increase of current in transistor $T_2$. The principle of the generation of the output impulse in the solution according to the present invention is shown in FIG. 5. The amplification voltage in the system is on average twice as high here (depending on the parameters of the transistors used) as in the known solution of FIG. 2. FIG. 5 represents a change in the potential of point $P_2$ as a result of the intersection of the collector characteristics of transistors $T_3$ and $T_4$, wherein $V_{EE}$ is the voltage between the emitters of transistors $T_3$ and $T_4$.

The input system of the charge integrator is therefore formed by two junctions of JFET-type transistors. It may be assumed that two diodes connected antiparallel constitute a safeguard against the occurrence of an excessively high voltage impulse.

Another important property of the solution according to the present invention is the possibility of optimizing the noise in the system when measuring charges of variable signs, which is particularly significant for measuring charges induced by currents of alternating direction. Integrator system noise is mainly associated with thermal noise from the feedback resistor $R_f$, thermal noise from the JFET transistor channel and shot noise associated with current flowing into the input integrator. To clearly describe the effect of these types of noise on device resolution it is possible to make several assumptions as to sources of the noise and the frequency at which the noise disrupts the signal generated by the detector.

Figure 6:
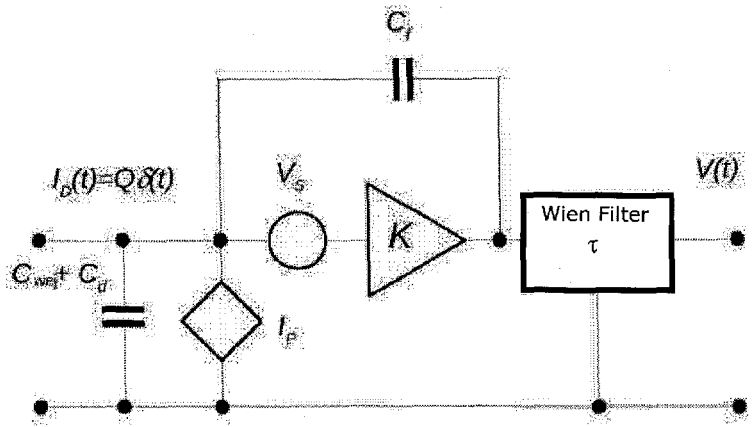
FIG. 6 represents an auxiliary schematic to demonstrate noise of the system.

It may thus be assumed that the system noise may be represented as respective current $I_p$ and voltage $V_s$ sources connected to the charge integrator as shown in FIG. 6.

It may be assumed that the band density of noise strength for the current source is defined by the formula:

$$\frac{d(\langle I^2 \rangle)}{df} = a$$

where the constant a describes the magnitude of a white noise. Such current sources represent noise associated with the coupling resistance $R_f$ and the shot noise of the gate current and the detector current. The value of the constant a may be defined as:

$$a = \frac{4kT}{R_f} + 2eI_G + 2eI_D$$

where e represents the electron charge.

In the presented simplification, it is assumed that the voltage of the noise source has a band density defined by the formula:

$$\frac{d(\langle V^2 \rangle)}{df} = b + \frac{A_F}{f}$$

where constant b defines a white noise, and constant $A_F$ characterises excess noise. For a field transistor, constant b is expressed as the mutual conductance $g_m$ (the slope of the JFET transistor characteristics) by the formula:

$$b = \frac{2.8 \, kT}{g_m}$$

Because the contribution of noise to signal output is dependent on the analysed frequency bands (in the system the capacitences $C_f$, $C_{wej}$, $C_d$ are present, which make the function of passage through the integrator system dependent on frequency), then an attempt may be made to optimize the signal to noise ratio through the selection of an appropriate frequency. In the present description, the Wien filter is used, based on an integrating and differentiating system with the same time constants τ.

With the aforementioned current and voltage sources, after the signal passes through the integrator and Wien filter, it is proportional to the ENC value (Equivalent Noise Charge) and is expressed by the formula:

$$(ENC)^2 = \frac{2.8\,kTC_{tot}^2}{\tau g_m} + 4A_F C_{tot}^2 + 2\tau e(I_G + I_D) + \frac{4kT\tau}{R_f}$$

where $C_{tot}=C_f+C_{wej}+C_d$

Typical values of this capacitance are Cf~1 pF, Cwej~5-20 pF, Cd~50-200 pF. If the measurement system is to possess an optimal signal to noise ratio, then the size of each component of the formula of ENC has to be reduced.

The optimization of the first component is associated with the remaining components and necessitates global optimization. Its minimalization is possible due to the number of parallel connected JFET-type transistors. If one assumes that $g_m$ slopes are similar, and capacitance detector $C_D$ is larger than $1.5\,C_{wej}$ (assuming $C_{wej} \gg C_f$), then a better solution may be a system with at least two pairs of JFET transistors connected in parallel ($\eta_{opt}=(C_D+C_f)/C_{wej}$).

The second component of the ENC sum is connected with structural noise. The subsequent component represents shot noise, which is connected to the discrete nature of the current carriers. This takes into account the current flowing through the detector and the gates of JFET transistors. This noise is usually dominated by the current detector, which is generally much larger than the gate current.

Figure 7:
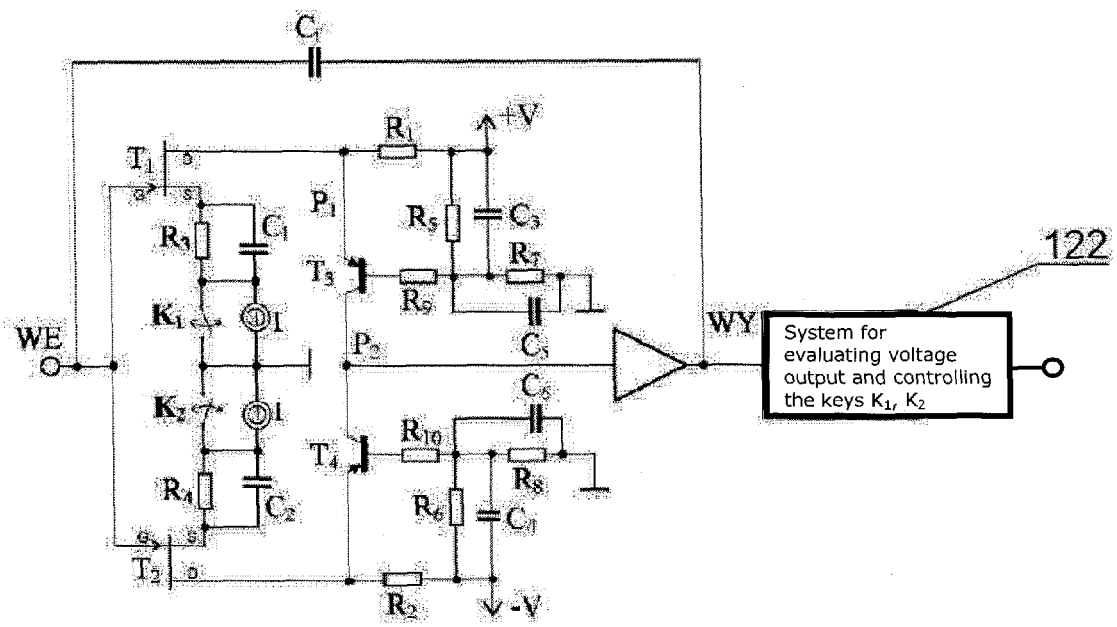
FIG. 7 represents a schematic of the charge integrator according to the present invention with a system for dissipating capacitance feedback.

The last significant component of the ENC sum is connected with feedback resistance $R_f$ and is inversely proportional thereto. In classical solutions, the system integrator resistance cannot be arbitrarily large and must be selected so as to ensure an appropriate system operating point. In the case of a very high count frequency this resistance must be small enough to keep up with $C_f$ capacitance discharges in order to dissipate the charge accumulated therein. In typical solutions, capacitance $C_f$ may be dissipated through a so-called optoelectronic coupling or a so-called coupling through drain, but these are of use solely in the case when the accumulated charge is of one polarity. When the accumulated charge is of any given polarity, these solutions, with a single JFET transistor type in the system input stage, are not possible. In the solution according to the present invention, we used voltage polarity steering with JFET transistors T1, T2, which induces the flow of appropriate currents dissipating capacitance $C_f$ through the gate-source junction, which may be called a coupling through source. A schematic of this solution is shown in FIG. 7. It ensures the discharge of the $C_f$ condenser in the case of both the predefined and alternating polarities of the induced charges. After exceeding the cut-off voltage, measured by the system 122, one of the keys $K_1$ or $K_2$ opens at capacitance $C_f$. When the upper $U_h$ level is reached, the key $K_2$ opens, and for voltages lower than $U_1$ thus the key $K_1$ opens. After the opening of one of the keys $K_1$, $K_2$, the current from an appropriate current source $I_1$, $I_2$ discharges the capacitance $C_f$. After reaching the appropriate voltage in capacitance $C_f$, the keys are closed and the system returns to its working configuration. The system for evaluating voltage output and controlling the keys $K_1$ and $K_2$ may be based on appropriate Schmitt triggers.

The invention claimed is:

1. A system for measuring electrical charge, comprising:
   (a) a charge integrator comprising an operational amplifier with capacitance feedback;
   (b) a capacitance detector directly connected with the input of the charge integrator; and
   (c) an evaluating system for evaluating an output voltage of the charge integrator,
   the charge integrator including an input stage, the input stage comprising a pair of symmetrically operatively coupled JFET type transistors having gates directly connected with an input of the charge integrator, wherein a first key in parallel with a first current source is directly connected with a source of a first transistor of the pair of symmetrically operatively coupled JFET-type transistors, and a second key in parallel with a second current source is directly connected with a source of a second transistor of the pair of symmetrically operatively coupled JFET-type transistors, and the evaluating system causes to open one of the first or second keys after the output voltage of the charge integrator exceeds an upper voltage limit and to open the other of the first or second keys when the output voltage of the charge integrator drops below a lower voltage limit, to discharge the capacitance feedback of the charge integrator.

2. A system of claim 1, wherein the input stage of the charge integrator comprises at least two parallel pairs of symmetrically operatively coupled JFET transistors.

3. The system of claim 1, wherein the input stage of the charge integrator is directly connected with a symmetrically operatively coupled common base amplifier.

* * * * *

UNITED STATES PATENT AND TRADEMARK OFFICE
CERTIFICATE OF CORRECTION

Page 1 of 1

PATENT NO.        : 9,103,860 B2
APPLICATION NO.   : 13/985594
DATED             : August 11, 2015
INVENTOR(S)       : Sosin It is certified that error appears in the above-identified patent and that said Letters Patent is hereby corrected as shown below:

In the claims:

Column 6 Claim 2 line 39
Change
    -- A system --
    to
    "The system"

Signed and Sealed this
Twenty-second Day of December, 2015

Michelle K. Lee
*Director of the United States Patent and Trademark Office*